United States Patent [19]

Nishihara et al.

[11] Patent Number: 5,147,454
[45] Date of Patent: Sep. 15, 1992

[54] ELECTROLESSLY SOLDER PLATING COMPOSITION

[75] Inventors: Yukio Nishihara, Hirakata; Akemi Oharada, Moriguchi, both of Japan

[73] Assignee: Okuno Chemical Industries Co., Ltd., Osaka, Japan

[21] Appl. No.: 466,528

[22] Filed: Jan. 17, 1990

[30] Foreign Application Priority Data

Jan. 24, 1989 [JP] Japan ................... 1-15822

[51] Int. Cl.$^5$ ............................ B22F 7/00; C09D 5/00
[52] U.S. Cl. ................................. 106/1.22; 106/1.05
[58] Field of Search ................ 106/1.22, 1.05, 1.25

[56] References Cited

U.S. PATENT DOCUMENTS

| | | | |
|---|---|---|---|
| 4,224,133 | 9/1980 | Takahashi | 106/1.22 |
| 4,407,869 | 10/1983 | Mallory et al. | 106/1.22 |
| 4,715,894 | 12/1987 | Holtzman et al. | 106/1.22 |
| 4,816,070 | 3/1989 | Holtzman et al. | 106/1.22 |
| 4,882,202 | 11/1989 | Holtzman et al. | 106/1.22 |

*Primary Examiner*—Josephine Barr
*Attorney, Agent, or Firm*—Armstrong, Nikaido, Marmelstein, Kubovcik & Murray

[57] ABSTRACT

The invention provides a bath composition for electroless solder plating comprising:

(A) about 5 to about 120 g/l of at least one compound selected from the group consisting of alkanesulfonic acids and alkanolsulfonic acids, (B) about 10 to about 100 g/l of at least one compound selected from the group consisting of tin salts of alkanesulfonic acids and tin salts of alkanolsulfonic acids, (C) about 10 to about 100 g/l of at least one compound selected from the group consisting of lead salts of alkanesulfonic acids and lead salts of alkanolsulfonic acids, (D) about 10 to about 200 g/l of at least one compound selected from the group consisting of thiourea and thiourea derivatives, and (E) about 1 to about 250 g/l of at least one compound selected from the group consisting of monocarboxylic acids, dicarboxylic acids, tricarboxylic acids and salts thereof.

19 Claims, No Drawings

ELECTROLESSLY SOLDER PLATING COMPOSITION

FIELD OF THE INVENTION

The present invention relates to a composition for electrolessly forming a solder plating on copper or copper alloy.

BACKGROUND OF THE INVENTION

Solder platings on mechanical parts or like substrates impart high corrosion resistance and good solderability to the substrate. Solder platings therefore have been widely applied to automotive parts or the like and in recent years to electronic equipment, precision mechanical equipment, printed circuit boards or the like.

Conventional baths for electrolessly solder plating include, for example, a borofluoride bath consisting essentially of borofluoric acid, stannous borofluoride and lead borofluoride, a chloride bath consisting essentially of stannous chloride, lead chloride and hydrochloric acid and containing thiourea, etc.

However, these baths have the problems resulting from the composition which include those of (a) being likely to corrode the substrate; (b) leaving waste water containing harmful ingredients; (c) deteriorating the work environment; and (d) evolving a halogen gas or the like from the plated substrate.

Stated more specifically, the borofluoric acid or hydrochloric acid present in the conventional electrolessly solder plating bath unavoidably errodes part of substrates of copper, copper alloy or the like. Accurately patterned components such as printed circuit boards, copper foil circuits or the like tend to be adversely affected as by variations of electroconductivity caused due to breaking of wire or varied wire width. To meet the requirement of semiconductor parts in computers being essentially free of halogen ions, a procedure is needed for washing plated substrates to remove the halogen ions. If the removal of halogen ions is incomplete, the plated substrate becomes susceptible to change of color or corrosion.

SUMMARY OF THE INVENTION

It is the main object of the present invention to provide an electrolessly solder plating composition which causes little or no corrosion on a substrate.

It is another object of the invention to provide an electrolessly solder plating composition which leaves no or little amount of harmful ingredients in the plating.

It is a further object of the invention to provide an electrolessly solder plating composition which does not deteriorate the environment in deposition.

It is a still further object of the invention to provide an electrolessly solder plating composition which does not evolve a halogen gas.

Other objects and the features of the invention will become apparent from the following description.

According to the invention, there is provided a bath composition for electrolessly solder plating comprising:
(A) about 5 to about 120 g/l of at least one compound selected from the group consisting of alkanesulfonic acids and alkanolsulfonic acids,
(B) about 10 to about 100 g/l of at least one compound selected from the group consisting of tin salts of alkanesulfonic acids and tin salts of alkanolsulfonic acids,
(C) about 10 to about 100 g/l of at least one compound selected from the group consisting of lead salts of alkanesulfonic acids and lead salts of alkanolsulfonic acids,
(D) about 10 to about 200 g/l of at least one compound selected from the group consisting of thiourea and thiourea derivatives, and
(E) about 1 to about 250 g/l of at least one compound selected from the group consisting of monocarboxylic acids, dicarboxylic acids, tricarboxylic acids and salts thereof.

Our research revealed that a novel bath comprising a combination of specific compounds and free of borofluoric acid or hydrochloric acid can substantially obviate or greatly mitigate the problems of conventional techniques. The present invention has been accomplished based on this novel finding.

DETAILED DESCRIPTION OF THE INVENTION

Examples of alkanesulfonic acids useful as the component (A) in the present invention include those represented by the formula

$$RSO_3H \qquad (1)$$

wherein R is an akyl group having 1 to 12 carbon atoms. Specific examples of such alkanesulfonic acids are methanesulfonic acid, ethanesulfonic acid, propanesulfonic acid, 2-propanesulfonic acid, butanesulfonic acid, 2-butanesulfonic acid, pentanesulfonic acid, hexanesulfonic acid, decanesulfonic acid, dodecanesulfonic acid, etc. among which those having an alkyl group of 1 to 6 carbon atoms are preferred.

Examples of alkanolsulfonic acids useful as the component (A) in the invention include those represented by the formula

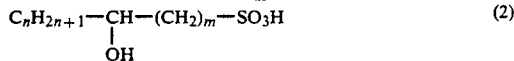

$$C_nH_{2n+1}-\underset{\underset{OH}{|}}{CH}-(CH_2)_m-SO_3H \qquad (2)$$

wherein m is an integer of 1 to 11, and n is an integer of 0 to 10, provided that $m+n \leqq 12$. Specific examples of such alkanolsulfonic acids are 2-hydroxyethyl-1-sulfonic acid, 2-hydroxypropyl-1-sulfonic acid, 3-hydroxypropyl-1-sulfonic acid, 2-hydroxybutyl-1-sulfonic acid, 4-hydroxybutyl-1-sulfonic acid, 2-hydroxypentyl-1-sulfonic acid, 4-hydroxypentyl-1-sulfonic acid, 2-hydroxyhexyl-1-sulfonic acid, 2-hydroxydecyl-1-sulfonic acid, 4-hydroxydecyl-1-sulfonic acid, etc.

The alkanesulfonic acids and the alkanolsulfonic acids exemplified above as the component (A) are usable singly or at least two of them can be used in mixture. The concentration of the component (A) in the solder plating bath of the invention is preferably about 5 to about 120 g/l, more preferably about 20 to about 80 g/l and is preferably about 1.5 or more times (mole ratio) more preferably about 1.5 to about 6 times (mole ratio), the combined amount of the tin and lead (other than the constituents of the salt) contained in the bath.

Examples of tin salts of acids useful as the component (B) in the invention include tin salts of alkanesulfonic acids represented by the formula

$$(RSO_3)_2Sn \qquad (3)$$

wherein R is an alkyl group having 1 to 12 carbon atoms, and tin salts of alkanolsulfonic acids represented by the formula

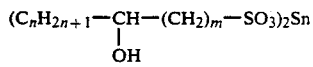 (4)

wherein m is an integer of 1 to 11 and n is an integer of 0 to 10, provided that $m+n \leq 12$. These bivalent tin salts are usable singly or at least two of them can be used in mixture. It is possible to use the tin salts of the acids identical with or different from the component (A). The concentration of the component (B) in the solder plating bath of the invention is about 5 to about 100 g/l, preferably about 15 to about 50 g/l, calculated as tin ions.

Examples of lead salts of acids as the component (C) include lead salts of alkanesulfonic acids represented by the formula

 (5)

wherein R is an-alkyl group having 1 to 12 carbon atoms and lead salts of alkanolsulfonic acids represented by the formula

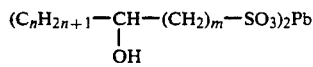 (6)

wherein m is an integer of 1 to 11, and n is an integer of 0 to 10, provided that $m+n \leq 12$. These bivalent lead salts are usable singly or at least two of them can be used in mixture. It is possible to use the lead salts of the acids identical with the component (A). The concentration of the component (C) in the solder plating bath of the invention is about 5 to about 100 g/l, preferably about 20 to about 60 g/l, calculated as lead ions.

The total concentration of the components (B) and (C) in the solder plating bath of the invention is preferably about 10 to about 150 g/l, more preferably about 35 to about 100 g/l, calculated as ions. The ratio of the component (B) to the component (C) is selected without specific limitation depending on the solder plating bath composition which can be determined according to a particular purpose of solder plating. Yet it is suitable to use about 0.5 to about 3 moles, preferably about 0.8 to about 1.5 moles, of the lead ions of the component (C), per mole of the tin ions of the component (B).

The composition of the invention contains at least one of thiourea and thiourea derivatives, namely the component (D) serving as a masking agent for stannous ions. Examples of useful thiourea derivatives are dimethylthiourea, trimethylthiourea, allylthiourea, acetylthiourea, ethylenethiourea, etc. The concentration of the component (D) in the solder plating bath of the invention is preferably about 10 to about 200 g/l, more preferably about 40 to about 150 g/l. If the concentration of the component (D) is less than 10 g/l, the reduction of masking effect results, tending to decrease the stability of the bath. On the other hand, if the concentration of the component (D) is above 200 g/l, incomplete dissolution may occur and deposits may be formed in insufficient degree with stain and unevenness.

According to the invention, the component (E) is used as a chelating agent for stabilizing the tin and lead dissolved in the solder plating bath. Useful chelating agent is at least one compound selected from the group consisting of monocarboxylic acids, dicarboxylic acids, tricarboxylic acids and salts thereof. Examples of useful monocarboxylic acids are glycolic acid, propionic acid, stearic acid, lactic acid, etc. Examples of useful dicarboxylic acids are oxalic acid, succinic acid, d-tartaric acid, adipic acid, etc. Useful tricarboxylic acids are citric acid, benzenetricarboxylic acid, 2,3,4-pyridinetricarboxylic acid, etc. Examples of the salts of these acids are those soluble in the solder plating bath of the invention such as salts of Na, K, NH$_4$ or the like. The concentration of the component (E) (as the acid) in the solder plating bath of the invention is preferably about 1 to about 250 g/l, more preferably about 10 to about 50 g/l. If the concentration of the acid is less than 1 g/l, a low chelating effect results, tending to reduce the stability of the bath, whereas if the concentration thereof is more than 250 g/l, the acid is difficult to completely dissolve, leading to economical disadvantage.

When required, the bath of the invention may contain various conventional additives.

For example, the plating formed from the bath comprising the components (A) to (E) has usually a gray to pale black color and is suitable for purposes such as the formation of undercoat for solder plating, or solder reflow, etc. If high gloss is required or if the plating of sponge-like texture and the formation of pits or pinholes are avoided by providing a denser arrangement of particles on the surface of the deposit, it is preferred to incorporate into the bath at least one of anionic, cationic, nonionic and amphoteric surfactants. The presence of a surfactant in the bath of the invention when utilized for the formation of a pattern on printed circuit boards can provide an interface sharply formed between the resist and the solder plating.

Examples of useful anionic surfactants are alkylsulfate, polyoxyethylene alkyl ether sulfate, polyoxyethylene alkyl ether acetate, alkylphenol sulfuric acid ester salt, alkylbenzene sulfuric aicd ester salt, etc. Among the adducts with ethylene oxide, those with 2 to 4 moles of ethylene oxide are preferred.

Examples of useful cationic surfactants are polyoxyethylene aliphatic amine, alkylbenzyl ammonium salt, alkylimidazoline quaternary salt, etc. Among the adducts with ethylene oxide, those with 8 to 12 moles of ethylene oxide are preferred.

Examples of useful nonionic surfactants are polyoxyethylene alcohol ether, polyoxyethylene alkyl phenyl ether, polyoxyethylene fatty acid ester, polyoxyethylene bisphenol, polyoxyalkyl naphthol, etc. Among the adducts with ethylene oxide, those with 8 to 12 moles of ethylene oxide are preferred.

Useful amphoteric surfactants are dimethylalkyl-laurylbetaine, imidazoliumbetaine, etc.

The electrolessly solder plating composition of the invention can be prepared as by mixing together the solutions containing the specific amounts of the components (A) to (E). Optionally tin (or bivalent tin oxide) and lead (or bivalent lead oxide) may be added to the excess of the component (A) to form components (B) and (C) as salts of acids to which the components (D) and (E) are added. Also available are any other methods capable of giving the composition of the invention comprising the specified proportions of the components (A) to (E).

The electrolessly solder plating bath composition of the invention can be used to form a solder film on substrates of copper or copper alloy, or substrates of plastics, ceramics or like materials coated with copper or copper alloy. While the conditions for electrolessly solder plating in the invention are the same as those for conventional baths for electrolessly solder plating, usually the substrate is immersed in the bath maintained at about 40° to about 90° C. The immersing time is suitably determined without specific limitation depending on the dimensions and shape of the substrate, the required thickness of the plating, etc., but usually in the range of about 10 seconds to about 60 minutes.

The electrolessly solder plating bath of the invention can achieve the following remarkable results.

(i) The bath, free of inorganic acid, causes little or no corrosion on copper or copper alloy, thus giving substantially no adverse effect to printed circuit boards, copper foil circuit boards or the like.

(ii) the tin-lead proportions in the composition are stable so that the bath exhibits a high deposition rate.

(iii) The solder plating formed from the bath is compact.

(iv) The bath, containing neither fluorine ion nor chlorine ion, eliminates the possibility of adversely affecting electronic equipment.

(v) The bath is less hazardous to use than conventional plating baths containing a fluoride or a chlorides.

(vi) The bath, free of a fluoride, is usable for the formation of solder plating on a copper-plated substrate of glass or ceramics.

Given below are Examples and Comparison Examples to clarify the features of the present invention in greater detail.

EXAMPLE 1

An electrolessly solder plating bath was prepared from the following ingredients.

| | |
|---|---|
| Methanesulfonic acid | 50 g/l |
| Tin methanesulfonate | 60 g/l |
| Lead methanesulfonate | 40 g/l |
| Thiourea | 70 g/l |
| Lactic acid | 50 g/l |

The obtained plating bath was maintained at a temperature of 70° C. Two rolled copper sheets (50×50 cm$^2$) with a 10-μm-thick copper plating were immersed in the bath for 10 minutes (Specimen 1-1) and 30 minutes (Specimen 1-2), respectively.

The solder platings on the sheets had a uniform alloy composition in their entirety.

Table 1 below shows the appearance, adhesion, thickness and alloy composition of solder platings formed in this example, other examples and comparison examples.

EXAMPLE 2

An electrolessly solder plating bath was prepared from the following ingredients.

| | |
|---|---|
| Methanesulfonic acid | 50 g/l |
| Tin methanesulfonate | 40 g/l |
| Lead methanesulfonate | 35 g/l |
| Thiourea | 80 g/l |
| Propionic acid | 20 g/l |
| Adduct of lauryl alcohol with 14 moles of ethylene oxide | 3 g/l |

The obtained plating bath was maintained at 70° C. Two copper sheets (50 mm×50 mm×0.3 mm) were immersed in the bath for 10 minutes (Specimen 2-1) and 30 minutes (Specimen 2-2), respectively.

The solder platings on the sheets were pinhole-free and uniform in the alloy composition in their entirety.

EXAMPLE 3

Two copper sheets were plated in the same manner as in Example 2 by immersion in the same electrolessly plating bath as used in Example 2 but prepared using 5 g/l of an adduct of nonylphenol with 18 moles of ethylene oxide in place of 3 g/l of the adduct of lauryl alcohol with 14 moles of ethylene oxide.

The solder platings on the sheets were pit-free, pinhole-free and uniform in the alloy composition in their entirety.

EXAMPLE 4

An electrolessly solder plating bath was prepared from the following ingredients.

| | |
|---|---|
| Methanesulfonic acid | 40 g/l |
| Tin methanesulfonate | 55 g/l |
| Lead methanesulfonate | 30 g/l |
| Thiourea | 70 g/l |
| d-Tartaric acid | 15 g/l |
| Adduct of oleylamine with 15 moles of ethylene oxide | 5 g/l |

The obtained plating bath was maintained at 70° C. Two sheets of epoxy resin (50 mm×50 mm) with a 10-μm-thick copper plating were immersed in the bath for 10 minutes (Specimen 4-1) and 30 minutes (Specimen 4-2), respectively.

The solder platings on the sheets had a smooth surface and had a uniform alloy composition in their entirety.

EXAMPLE 5

Solder platings were formed in the same manner as in Example 4 by immersion in the same electrolessly plating bath as used in Example 4 but prepared using 1 g/l of dodecylbenzenesulfonic acid in place of 5 g/l of the adduct of oleylamine with 15 moles of ethylene oxide.

The solder platings on the sheets (Specimens 5-1 and 5-2) had a smooth surface, dense texture and a uniform alloy composition in their entirety.

EXAMPLE 6

An electrolessly solder plating bath was prepared from the following ingredients.

| | |
|---|---|
| Tin hydroxyethanesulfonate | 50 g/l |
| Lead hydroxyethanesulfonate | 40 g/l |
| Hydroxyethanesulfonic acid | 30 g/l |
| Thiourea | 80 g/l |
| Citric acid | 20 g/l |
| Adduct of nonylphenyl ether sulfuric acid salt with 4 moles of ethylene oxide | 4 g/l |

The plating bath was maintained at 70° C. Two copper sheets (50 mm×50 mm×0.3 mm) were immersed in the bath for 10 minutes (Specimen 6-1) and 30 minutes (Specimen 6-2), respectively.

The solder platings on the sheets had a high adhesion to the sheets and a uniform alloy composition in their entirety and were pinhole-free.

EXAMPLE 7

Solder platings were formed in the same manner as in Example 6 by immersion in the same electrolessly plating bath as used in Example 6 but prepared using a mixture of 20 g/l of methanesulfonic acid and 20 g/l of hydroxyethanesulfonic acid in place of 30 g/l of hydroxyethanesulfonic acid.

The solder platings on the sheets had a high adhesion to the sheets and a uniform alloy composition in their entirety.

EXAMPLE 8

An electrolessly solder plating bath was prepared from the following ingredients.

| | |
|---|---|
| Methanesulfonic acid | 40 g/l |
| Tin methanesulfonate | 50 g/l |
| Lead methanesulfonate | 40 g/l |
| Thiourea | 70 g/l |
| Trimethylthiourea | 15 g/l |
| Adipic acid | 20 g/l |
| Adduct of nonylphenyl ether acetic acid salt with 6 moles of ethylene oxide | 4 g/l |

The obtained plating bath was maintained at 70° C. Two sheets of phenolic resin (50 mm×50 mm) with a 10-μm-thick copper pyrophosphate plating were immersed in the bath for 10 minutes (Specimen 8-1) and 30 minutes (Specimen 8-2), respectively.

The solder platings on the sheets had a smooth surface and were high in the adhesion, pit-free, pinhole-free and uniform in the alloy composition in their entirety.

EXAMPLE 9

An electrolessly solder plating bath was prepared from the following ingredients.

| | |
|---|---|
| Tin hydroxypropylsulfonate | 60 g/l |
| Lead hydroxyethanesulfonate | 40 g/l |
| Methanesulfonic acid | 30 g/l |
| Thiourea | 70 g/l |
| Allylthiourea | 25 g/l |
| Benzenetricarboxylic acid | 40 g/l |
| Adduct of methylimidazolium with 21 moles of ethylene oxide | 4 g/l |

The plating bath was maintained at 70° C. Two sheets of epoxy resin (50 mm×50 mm) with a 10-μm-thick copper sulphate plating were immersed in the bath for 10 minutes (Specimen 9-1) and 30 minutes (Specimen 9-2), respectively.

The solder platings on the sheets were high in the adhesion, pit-free, pinhole-free and uniform in the alloy composition in their entirety.

EXAMPLE 10

An electrolessly solder plating bath was prepared from the following ingredients.

| | |
|---|---|
| Methanesulfonic acid | 40 g/l |
| Tin ethanesulfonate | 55 g/l |
| Lead ethanesulfonate | 40 g/l |

| -continued | |
|---|---|
| Thiourea | 60 g/l |
| Ethylenethiourea | 10 g/l |
| Succinic acid | 30 g/l |
| Adduct of β-naphthol with 6 moles of ethylene oxide | 10 g/l |

The plating bath was maintained at 70° C. Two copper sheets (50 mm×50 mm×0.3 mm) were immersed in the bath for 10 minutes (Specimen 10-1) and 30 minutes (Specimen 10-2), respectively.

The milky, smooth-surfaced solder platings on the sheets were high in the adhesion, pinhole-free and uniform in the alloy composition in their entirety.

COMPARISON EXAMPLE 1

A conventional borofluoride bath for electrolessly solder plating was prepared from the following ingredients.

| | |
|---|---|
| Stannous borofluoride | 0.1 mole/l |
| Lead borofluoride | 0.025 mole/l |
| Borofluoric acid | 0.1 mole/l |
| Thiourea | 1.5 moles/l |
| Sodium hypophosphite | 0.2 mole/l |
| Nonionic surfactant | 0.5 mole/l |

The plating bath was maintained at 70° C. A copper sheet (50 mm×50 mm×0.3 mm) was immersed in the bath for 10 minutes.

The plating on the sheet was lusterless and had a poor surface smoothness and a low lead content (89% tin and 11% lead). And the plating was only 1.2 μm thick because of low deposition rate.

COMPARISON EXAMPLE 2

A chloride bath for electrolessly solder plating was prepared from the following ingredients.

| | |
|---|---|
| Stannous chloride | 20 g/l |
| Lead chloride | 11 g/l |
| Thiourea | 110 g/l |
| Sodium hypophosphite | 20 g/l |
| EDTA | 30 g/l |
| Gelatin | 1 g/l |

The plating bath was maintained at 70° C. A sheet of phenolic resin (50 mm×50 mm) with a 10-μm-thick copper sulfate plating was immersed in the bath for 10 minutes.

Precipitation of lead chloride-thiourea complex occurred during the application of plating. The plating on the sheet was markedly nonhomogeneous and irregular in the composition and had a low lead content (88% tin and 12% lead). Moreover, the plating was only 0.8 μm thick because of low deposition rate.

COMPARISON EXAMPLE 3

A chloride bath for electrolessly solder plating was prepared from the following ingredients.

| | |
|---|---|
| Stannous chloride | 0.1 mole/l |
| Lead chloride | 0.1 mole/l |
| Thiourea | 1.5 moles/l |
| Hydrazine hydrochloride | 0.5 mole/l |
| Hydrochloric acid | 1.2 moles/l |

The plating bath was maintained at 70° C. A sheet of phenolic resin (50 mm×50 mm) with a 10-μm-thick copper sulfate plating was immersed in the bath for 10 minutes.

The plating on the sheet was lusterless and had a poor surface smoothness and a low lead content (89% tin and 11% lead). The plating was only 1.2 μm thick because of low deposition rate.

EXAMPLE 11

An electrolessly solder plating bath was prepared from the following ingredients.

| | |
|---|---|
| Pentanesulfonic acid | 40 g/l |
| Tin pentanesulfonate | 70 g/l |
| Lead pentanesulfonate | 50 g/l |
| Thiourea | 80 g/l |
| Glycollic acid | 40 g/l |
| Adduct of lauryl ether sulfuric acid salt with 4 moles of ethylene oxide | 2 g/l |

The plating bath was maintained at 70° C. Two copper sheets (50 mm×50 mm×0.3 mm) were immersed in the bath for 10 minutes (Specimen 11-1) and 30 minutes (Specimen 11-2), respectively.

The solder platings on the sheets showed excellent properties substantially the same as the platings obtained in Example 1.

EXAMPLE 12

An electrolessly solder plating bath was prepared from the following ingredients.

| | |
|---|---|
| Ethanesulfonic acid | 40 g/l |
| Tin ethanesulfonate | 55 g/l |
| Lead ethanesulfonate | 50 g/l |
| Thiourea | 70 g/l |
| Dimethylthiourea | 10 g/l |
| Propionic acid | 30 g/l |
| Adduct of amine oleate with 15 moles of ethylene oxide | 3 g/l |

The plating bath was maintained at 70° C. Two copper sheets (50 mm×50 mm×0.3 mm) were immersed in the bath for 10 minutes (Specimen 12-1) and 30 minutes (Specimen 12-2), respectively.

The solder platings on the sheets showed excellent properties substantially the same as the platings obtained in Example 1.

EXAMPLE 13

An electrolessly solder plating bath was prepared from the following ingredients.

| | |
|---|---|
| Methanesulfonic acid | 50 g/l |
| Tin 1-hydroxypropyl-2-sulfonate | 75 g/l |
| Lead 1-hydroxypropyl-2-sulfonate | 60 g/l |
| Thiourea | 80 g/l |
| Citric acid | 35 g/l |
| Adduct of bisphenol ether with 10 moles of ethylene oxide | 10 g/l |

The plating bath was maintained at 70° C. Two copper sheets (50 mm×50 mm×0.3 mm) were immersed in the bath for 10 minutes (Specimen 13-1) and 30 minutes (Specimen 13-2), respectively.

The solder platings on the sheets showed excellent properties substantially the same as the platings obtained in Example 1.

EXAMPLE 14

An electrolessly solder plating bath was prepared from the following ingredients.

| | |
|---|---|
| 2-hydroxy-hexyl-1-sulfonic acid | 60 g/l |
| Tin 2-hydroxy-hexyl-1-sulfonate | 80 g/l |
| Lead 2-hydroxy-hexyl-1-sulfonate | 65 g/l |
| Thiourea | 70 g/l |
| Trimethylthiourea | 15 g/l |
| Glycollic acid | 40 g/l |
| Adduct of dodecylphenyl ether with 9 moles of ethylene oxide | 3 g/l |

The plating bath was maintained at 70° C. Two copper sheets (50 mm×50 mm×0.3 mm) were immersed in the bath for 10 minutes (Specimen 14-1) and 30 minutes (Specimen 14-2), respectively.

The solder platings on the sheets showed excellent properties substantially the same as the platings obtained in Example 1.

EXAMPLE 15

An electrolessly solder plating bath was prepared from the following ingredients.

| | |
|---|---|
| 4-hydroxybutyl-1-sulfonic acid | 40 g/l |
| Tin 4-hydroxybutyl-1-sulfonate | 70 g/l |
| Lead 4-hydroxybutyl-1-sulfonate | 60 g/l |
| Thiourea | 80 g/l |
| Adipic acid | 25 g/l |
| Adduct of β-naphthol ether with 13 moles of ethylene oxide | 8 g/l |

The plating bath was maintained at 70° C. Two copper sheets (50 mm×50 mm×0.3 mm) were immersed in the bath for 10 minutes (Specimen 15-1) and 30 minutes (Specimen 15-2), respectively.

The solder platings on the sheets showed excellent properties substantially the same as the platings obtained in Example 1.

TABLE 1

| Specimen | Appearance | Adhesion | Thickness of plating (μm) | Composition (%) Sn | Pb |
|---|---|---|---|---|---|
| 1-1 | B | A | 2.8 | 76 | 24 |
| 1-2 | B | A | 5.1 | 82 | 18 |
| 2-1 | A | A | 2.6 | 62 | 38 |
| 2-2 | A | A | 4.8 | 71 | 29 |
| 3-1 | A | A | 2.5 | 65 | 35 |
| 3-2 | A | A | 4.6 | 73 | 27 |
| 4-1 | A | B | 2.5 | 82 | 18 |
| 4-2 | A | B | 4.8 | 90 | 10 |
| 5-1 | B | B | 2.2 | 84 | 16 |
| 5-2 | B | B | 3.9 | 89 | 11 |
| 6-1 | A | A | 3.1 | 61 | 39 |
| 6-2 | A | A | 5.3 | 70 | 30 |
| 7-1 | A | A | 2.9 | 62 | 38 |
| 7-2 | A | A | 4.8 | 69 | 31 |
| 8-1 | A | A | 3.0 | 76 | 24 |
| 8-2 | A | A | 5.1 | 82 | 18 |
| 9-1 | A | B | 2.3 | 78 | 22 |
| 9-2 | A | B | 4.6 | 83 | 17 |
| 10-1 | A | A | 2.6 | 72 | 28 |
| 10-2 | A | A | 4.4 | 79 | 21 |
| 11-1 | A | B | 2.2 | 76 | 24 |
| 11-2 | A | B | 4.1 | 82 | 18 |
| 12-1 | B | B | 2.7 | 68 | 32 |
| 12-2 | B | B | 4.9 | 74 | 26 |

TABLE 1-continued

| Specimen | Appearance | Adhesion | Thickness of plating (μm) | Composition (%) Sn | Pb |
| --- | --- | --- | --- | --- | --- |
| 13-1 | A | A | 2.5 | 70 | 30 |
| 13-2 | A | A | 4.3 | 80 | 20 |
| 14-1 | A | A | 2.4 | 72 | 28 |
| 14-2 | A | A | 4.5 | 81 | 19 |
| 15-1 | A | A | 3.0 | 68 | 32 |
| 15-2 | A | A | 5.4 | 75 | 25 |
| Comp. Ex. 1 | C | B | 1.2 | 89 | 11 |
| Comp. Ex. 2 | D | D | 0.8 | 88 | 12 |
| Comp. Ex. 3 | D | D | 1.2 | 89 | 11 |

Table 1 shows the results of, for example, Specimen 1-1 prepared by immersing the substrate in the plating bath for 10 minutes, and Specimen 1-2 prepared by immersing the substrate in the same bath for 30 minutes. The two specimens prepared in each of other examples were obtained by respective 10- and 30-minute immersions. The specimens prepared in the comparison examples were all obtained by ten-minute immersion.

The appearance and adhesion of the platings were assessed by the following methods. Appearance: The surface of the solder plating was observed under a microscope (100 ×) and the appearance was evaluated according to the following criteria in terms of the degree of surface irregularities.

A: Excellent
B: Good
C: Fair
D: Poor

Adhesion: The plating surface was cut crosswise to the substrate with a cutter by making 11 cuts extending in longitudinal and lateral directions and spaced away from each other at a distance of 2 mm to form 100 squares. An adhesive tape was applied to the cut surface and peeled. The adhesion was evaluated according to the following criteria in terms of the number of squares from which the tape was removed.

A: No peeling.
B: 5 or less squares.
C: 5 to 20 squares.
D: 20 or more squares.

We claim:

1. A bath composition for electroless solder plating comprising:
   (A) about 5 to about 120 g/l of at least one compound selected from the group consisting of alkanesulfonic acids represented by formula (1) and alkanolsulfonic acids represented by formula (2),

$$RSO_3H \qquad \text{formula (1)}$$

wherein R is an alkyl group of 1 to 12 carbon atoms

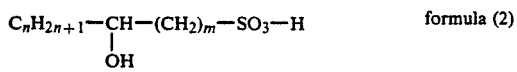

$$C_nH_{2n+1}-\underset{\underset{OH}{|}}{CH}-(CH_2)_m-SO_3-H \qquad \text{formula (2)}$$

wherein m is an integer of 1 to 11, and n is an integer of 0 to 10, provided that $m+n \leq 12$;
   (B) about 10 to about 100 g/l of at least one compound selected from the group consisting of tin salts of said alkanesulfonic acids and tin salts of said alkanolsulfonic acids,
   (C) about 10 to about 100 g/l of at least one compound selected from the group consisting of lead salts of said alkanesulfonic acids and lead salts of said alkanolsulfonic acids,
   (D) about 10 to about 200 g/l of at least one compound selected from the group consisting of thiourea, dimethylthiourea, trimethylthiourea, allylthiourea, acetylthiourea and ethylthiourea, and
   (E) about 1 to about 250 g/l of at least one compound selected from the group consisting of $C_2-C_{18}$ monocarboxylic acids, $C_2-C_6$ dicarboxylic acids, $C_6-C_8$ tricarboxylic acids and sodium, potassium and ammonium salts thereof.

2. A plating bath composition according to claim 1 wherein the alkanesulfonic acid in which R in the formula (1) is an alkyl group of 1 to 6 carbon atoms is used.

3. A plating bath composition according to claim 1 wherein the alkanolsulfonic acid is at least one compound selected from the group consisting of 2-hydroxyethyl-1-sulfonic acid, 2-hydroxypropyl-1-sulfonic acid, 3-hydroxypropyl-1-sulfonic acid, 2-hydroxybutyl-1-sulfonic acid, 4-hydroxybutyl-1-sulfonic acid, 2-hydroxypentyl-1-sulfonic acid, 4-hydroxypentyl-1-sulfonic acid, 2-hydroxyhexyl-1-sulfonic acid, 2-hydroxydecyl-1-sulfonic acid and 4-hydroxydecyl-1-sulfonic acid.

4. A plating bath composition according to claim 1 wherein the concentration of the component (A) in the solder plating bath is about 5 to about 120 g/l and about 1.5 or more times (mole ratio) the combined amount of the tin and lead (other than the constituents of the salt) contained in the bath.

5. A plating bath composition according to claim 4 wherein the concentration of the component (A) in the plating bath is about 20 to about 80 g/l, and about 1.5 to about 6 times (mole ratio) the combined amount of the tin and lead (other than the constituents of the salt) contained in the bath.

6. A plating bath composition according to claim 1 wherein the proportions of the components (B) and (C) in the solder plating bath is about 0.5 to about 3 moles of the lead ions of the component (C) per mole of the tin ions of the component (B).

7. A plating bath composition according to claim 6 wherein the proportions of the components (B) and (C) in the solder plating bath is about 0.8 to about 1.5 moles of the lead ions of the component (C) per mole of the tin ions of the component (B).

8. A plating bath composition according to claim 1 wherein the component (D) in the bath is thiourea.

9. A plating bath composition according to claim 8 wherein the component (D) is at least one compound selected from the group consisting of dimethylthiourea, trimethylthiourea, allylthiourea, acetylthiourea and ethylenethiourea.

10. A plating bath composition according to claim 1 wherein the concentration of the component (D) in the solder plating bath is about 40 to about 150 g/l.

11. A plating bath composition according to claim 1 wherein the component (E) in the bath is a monocarboxylic acid.

12. A plating bath composition according to claim 11 wherein the monocarboxylic acid is at least one compound selected from the group consisting of glycollic acid, propionic acid, stearic acid and lactic acid.

13. A plating bath composition according to claim 1 wherein the component (E) in the bath is a dicarboxylic acid.

14. A plating bath composition according to claim 13 wherein the dicarboxylic acid is at least one compound selected from the group consisting of oxalic acid, succinic acid, d-tartaric acid and adipic acid.

15. A plating bath composition according to claim 1 wherein the component (E) in the bath is a tricarboxylic acid.

16. A plating bath composition according to claim 15 wherein the tricarboxylic acid is at least one compound selected from the group consisting of citric acid, benzenetricarboxylic acid and 2,3,4-pyridinetricarboxylic acid.

17. A plating bath composition according to claim 1 wherein the component (E) in the bath is at least one compound selected from the group consisting of salts moncarboxylic acids, dicarboxylic acids and tricarboxylic acids soluble in the bath.

18. A plating bath composition according to claim 17 wherein the salts of these acids soluble in the bath are salts of Na, K or $NH_4$.

19. A plating bath composition according to claim 1 wherein the concentration of the component (E) in the solder plating bath is about 10 to about 50 g/l.

* * * * *